United States Patent
Chien

(10) Patent No.: US 10,845,136 B1
(45) Date of Patent: Nov. 24, 2020

(54) CAPSULE TYPE HEAT CONDUCTION COLUMN AND METHOD FOR MANUFACTURING THE SAME

(71) Applicant: TRUSVAL TECHNOLOGY CO., LTD., Chu-Nan Township (TW)

(72) Inventor: Shih Pao Chien, Chu-Nan Township (TW)

(73) Assignee: Trusval Technology Co., Ltd., Maio-Li County (TW)

( * ) Notice: Subject to any disclaimer, the term of this patent is extended or adjusted under 35 U.S.C. 154(b) by 21 days.

(21) Appl. No.: 16/422,170

(22) Filed: May 24, 2019

(51) Int. Cl.
*F28F 21/08* (2006.01)
*F28F 21/02* (2006.01)
*H05K 7/20* (2006.01)

(52) U.S. Cl.
CPC ............ *F28F 21/02* (2013.01); *F28F 21/081* (2013.01); *H05K 7/2029* (2013.01); *H05K 7/2039* (2013.01); *F28F 2210/08* (2013.01); *F28F 2235/00* (2013.01); *F28F 2255/08* (2013.01); *F28F 2275/02* (2013.01)

(58) Field of Classification Search
CPC .... F28F 2275/00–2275/22; F28F 21/02; F28F 21/081; F28F 2255/08; F28F 2210/08; F28F 2275/02; F28F 2235/00; H05K 7/2039; H05K 7/2029
USPC ................................... 165/80.3, 104.15, 133
See application file for complete search history.

(56) References Cited

U.S. PATENT DOCUMENTS

| | | | | |
|---|---|---|---|---|
| 3,404,061 A * | 10/1968 | Bochman | ................. | D01F 9/12 428/143 |
| 4,320,796 A * | 3/1982 | Smith | ....................... | F28C 3/14 165/104.15 |
| 4,455,135 A * | 6/1984 | Bitterly | .................... | B01J 3/006 208/400 |
| 4,478,276 A * | 10/1984 | Rosenbaum | .............. | F25B 9/12 165/133 |
| 5,741,342 A * | 4/1998 | Alexander | ............. | C03B 3/023 65/136.1 |
| 7,420,810 B2 * | 9/2008 | Reis | ....................... | C09K 5/041 165/104.26 |
| 9,920,232 B2 * | 3/2018 | Aoki | ........................ | B22F 3/10 |
| 2004/0055798 A1* | 3/2004 | Almkermann | ............ | F01N 3/08 180/65.21 |
| 2005/0121173 A1* | 6/2005 | Inagaki | ................. | H01L 25/074 165/80.3 |
| 2008/0062651 A1* | 3/2008 | Reis | ....................... | C09K 5/041 361/710 |
| 2012/0189839 A1* | 7/2012 | Aoki | ........................ | B22F 9/04 428/328 |
| 2012/0328503 A1* | 12/2012 | Fahrenbruck | ....... | C01B 33/1071 423/342 |

(Continued)

*Primary Examiner* — Lawrence Averick
(74) *Attorney, Agent, or Firm* — Rosenberg, Klein & Lee

(57) ABSTRACT

The present invention relates to a capsule type heat conduction column and a method for manufacturing the same. The method comprises the steps of mixing a thermally conductive base material thoroughly, stuffing and compacting the thermally conductive base material into a capsule formed by a first pipe and a second pipe, and sealing the capsule by a plurality of thermal interface materials. Each of the first pipe and the second pipe has a first opening and a second opening at two terminals thereof, and the second opening of the first pipe is assembled to the first opening of the second pipe.

3 Claims, 4 Drawing Sheets

(56) References Cited

U.S. PATENT DOCUMENTS

2015/0307765 A1* 10/2015 Aoki .................. B22F 7/08
427/216

* cited by examiner

CAPSULE TYPE HEAT CONDUCTION COLUMN AND METHOD FOR MANUFACTURING THE SAME

BACKGROUND OF THE INVENTION

1. Field of the Invention

The present invention relates to a capsule type heat conduction column and a method for manufacturing the same, which increases efficiency of 3-dimensional heat dissipation and electromagnetic wave absorption, maintains a long service life with high performance, reduces a manufacturing cost, and has environmental friendly effect due to its recyclability so as to improve its whole practical feature.

2. Description of Related Art

With the rapid development of high technology, a volume of an electronic component tends to be smaller, a density of the electronic component in a unit area tends to be higher, and efficacies of the electronic component tend to be more powerful. Therefore, a total heat generation quantity of the electronic component is yearly increased, and a traditional heat dissipating device cannot afford to dissipate the total heat generation quantity quickly. When the total heat generated by the electronic component is not removed efficiently, it leads to an electronic ionization and a thermal stress situation of the electronic component which reduces an overall stability and a service life of the electronic component. Accordingly, it is imperative to dissipate the heat generated from the electronic component to prevent a overheat situation thereof.

SUMMARY OF THE INVENTION

The present invention provides a capsule type heat conduction column and a method for manufacturing the same, which increases efficiency of 3-dimensional heat dissipation and electromagnetic wave absorption, maintains a long service life with high performance, reduces a manufacturing cost, and has environmental friendly effect due to its recyclability so as to improve its whole practical feature.

The method for manufacturing a capsule type heat conduction column of the present invention comprises the steps of:

(A) mixing a thermally conductive base material thoroughly;

(B) stuffing and compacting the thermally conductive base material into a capsule formed by a first pipe and a second pipe, wherein each of the first pipe and the second pipe has a first opening and a second opening at two terminals thereof, and wherein the second opening of the first pipe is assembled to the first opening of the second pipe; and (C) sealing the first opening of the first pipe and the second opening of the second pipe of the capsule by a plurality of thermal interface materials.

According to an embodiment of the present invention, the thermally conductive base material is prepared by mixing a first material and a second material thoroughly, the first material is selected from the group consisting of a grapheme, a carbon nanotube, a reduced expanded graphite, a carbon fiber and a carbon, and the second material is selected from the group consisting of a phase change material, a high molecular conductive polymer, a metal material having a high thermal conductivity and a plurality of non-metal granules.

According to an embodiment of the present invention, the thermally conductive base material is stuffed into the capsule by a stuffing machine.

Furthermore, a capsule type heat conduction column of the present invention is also disclosed herein. It comprises a thermally conductive base material, a capsule and a plurality of thermal interface materials. The thermally conductive base material is stuffed into and compacted in the capsule. The capsule has a first pipe and a second pipe, and each of the first pipe and the second pipe has a first opening and a second opening at two terminals thereof. The second opening of the first pipe is assembled to the first opening of the second pipe to form the capsule. The plurality of thermal interface materials are respectively disposed at the first opening of the first pipe and the second opening of the second pipe of the capsule for sealing.

According to an embodiment of the present invention, the thermally conductive base material is prepared by mixing a first material and a second material thoroughly, the first material is selected from the group consisting a grapheme, a carbon nanotube, a reduced expanded graphite, a carbon fiber and a carbon, and the second material is selected from the group consisting a phase change material, a high molecular conductive polymer, a metal material having a high thermal conductivity and a plurality of non-metal granules.

According to an embodiment of the present invention, the thermally conductive base material is stuffed into the capsule by a stuffing machine.

DETAILED DESCRIPTION OF THE PREFERRED EMBODIMENT

To provide a thorough understanding, the purpose and advantages of the present invention will be described in detail with reference to the accompany drawings.

Figure 1:
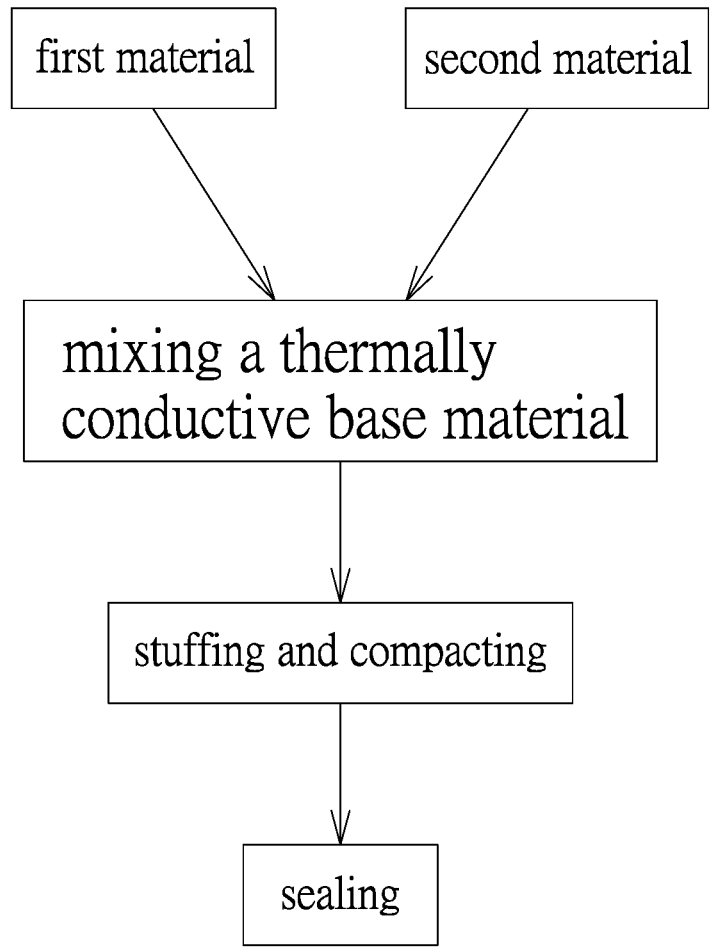
FIG. 1 is a flow chart showing a method for manufacturing a capsule type heat conduction column of the present invention.
Figure 2:
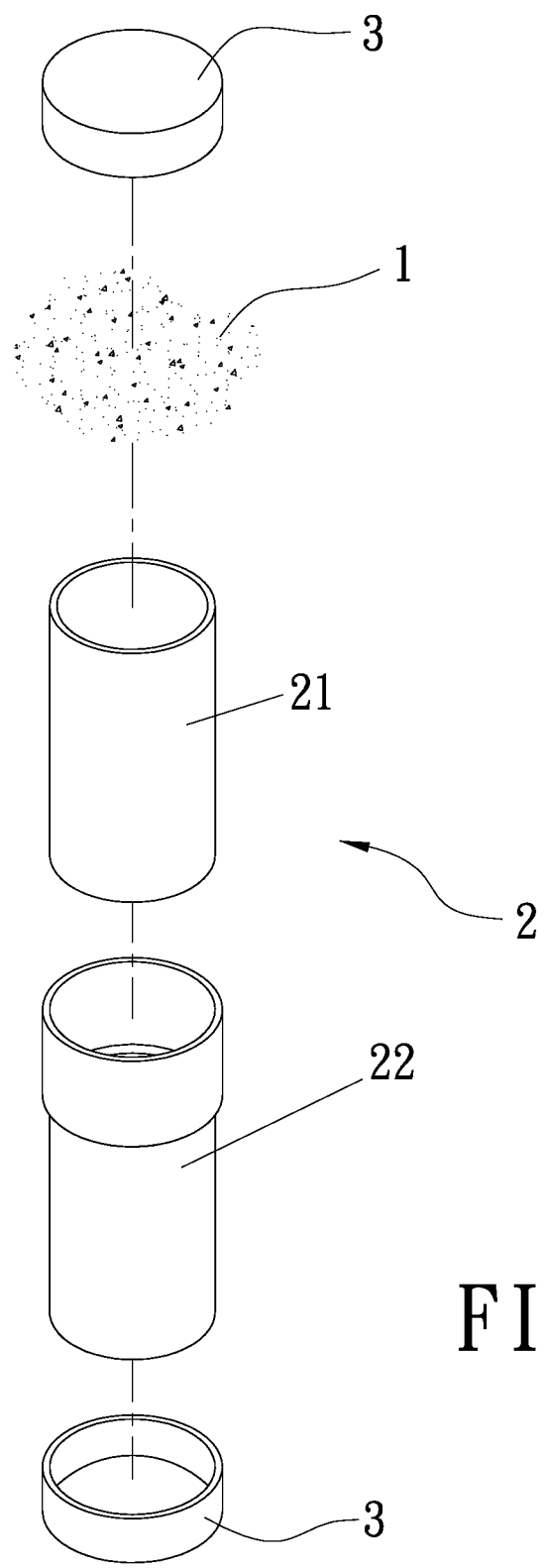
FIG. 2 is an exploded diagram showing a capsule type heat conduction column of the present invention.

Referring to FIG. 1 and FIG. 2 showing a flow chart of a method for manufacturing a capsule type heat conduction column and an exploded diagram thereof, the method of present invention comprises the steps of:

(A) Fixing a first material and a second material thoroughly to obtain a thermally conductive base material (1), wherein the first material is selected from the group consisting of a grapheme, a carbon nanotube, a reduced expanded graphite, a carbon fiber and a carbon, and wherein the second material is selected from the group consisting of a phase change material, a high molecular conductive polymer, a metal material having a high thermal conductivity and a plurality of non-metal granules.

(B) The thermally conductive base material (1) is stuffed into a capsule (2) by a stuffing machine, and is compacted in the capsule (2). The capsule (2) is formed by a first pipe (21) and a second pipe (22), and each of the first pipe (21) and the second pipe (22) has a first opening and a second opening at two terminals thereof, and the second opening of the first pipe (21) is assembled to the first opening of the second pipe (22) to form the capsule (2).

Figure 3:
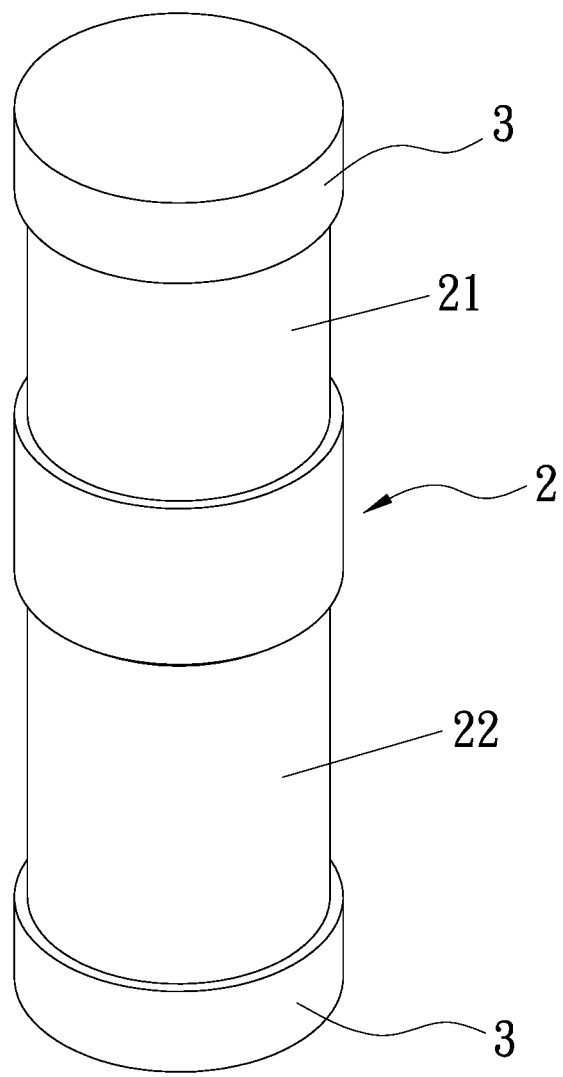
FIG. 3 is a stereogram showing a capsule type heat conduction column of the present invention.
Figure 4:
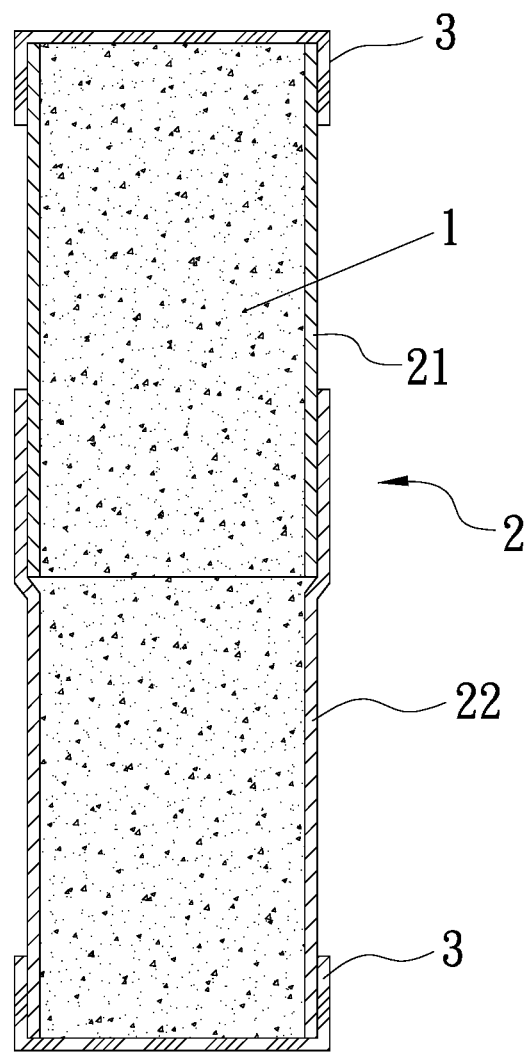
FIG. 4 is a sectional view showing a capsule type heat conduction column of the present invention.

(C) Please referring to FIG. 3 and FIG. 4, the first opening of the first pipe (21) and the second opening of the second pipe (22) are sealed by a plurality of thermal interface materials (3) to provide efficacy of thermal conductivity and prevent leakage of the thermally conductive base material (1) from the capsule (2).

Accordingly, to use the capsule type heat conduction column of the present invention, the plurality of thermal interface materials (3) is contacted to an object to be cooled and dissipate the heat of the object by the thermally conductive base material (1) in the capsule (2) to achieve an improved heat dissipation effect.

According to the description of the embodiment above, the present invention has advantages of:

1. The present invention increases efficiency of 3-dimensional heat dissipation, and increases efficiency of electromagnetic wave absorption or decreases reflection interference of electromagnetic wave.

2. The present invention is not oxidized and damaged and maintains a long serve life with high performance.

3. It is easy to manufacture the capsule type heat conduction column of the present invention and the method for manufacturing the present invention has a low attrition rate and a high yield rate to reduce a manufacturing cost.

4. The method for manufacturing the present invention does not cause environmental damage, and the present invention is environmental friendly due to its recyclability.

What is claimed is:

1. A method for manufacturing a capsule type heat conduction column, comprising the steps of:

(A) mixing a thermally conductive base material thoroughly;

(B) stuffing and compacting the thermally conductive base material into a capsule formed by a first pipe and a second pipe, wherein each of the first pipe and the second pipe has a first opening and a second opening at two terminals thereof, and wherein the second opening of the first pipe is assembled to the first opening of the second pipe; and (C) sealing the first opening of the first pipe and the second opening of the second pipe of the capsule by a plurality of thermal interface materials.

2. The method as claimed in claim 1, wherein the thermally conductive base material is prepared by mixing a first material and a second material thoroughly, wherein the first material is selected from the group consisting of a grapheme, a carbon nanotube, a reduced expanded graphite, a carbon fiber and a carbon, and wherein the second material is selected from the group consisting of a phase change material, a high molecular conductive polymer, a metal material having a high thermal conductivity and a plurality of non-metal granules.

3. The method as claimed in claim 1, wherein the thermally conductive base material is stuffed into the capsule by a stuffing machine.

* * * * *